United States Patent
Yang

(10) Patent No.: US 9,412,615 B2
(45) Date of Patent: Aug. 9, 2016

(54) PATTERNING METHOD AND SEMICONDUCTOR STRUCTURE INCLUDING FORMING A PLURALITY OF HOLES USING LINE PATTERN MASKS

(71) Applicant: MACRONIX International Co., Ltd., Hsinchu (TW)

(72) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/492,969

(22) Filed: Sep. 22, 2014

(65) Prior Publication Data

US 2016/0086809 A1    Mar. 24, 2016

(51) Int. Cl.
*H01L 21/4763* (2006.01)
*H01L 21/308* (2006.01)
*H01L 21/311* (2006.01)

(52) U.S. Cl.
CPC ........ *H01L 21/3088* (2013.01); *H01L 21/3086* (2013.01); *H01L 21/31105* (2013.01); *H01L 21/31127* (2013.01)

(58) Field of Classification Search
None
See application file for complete search history.

(56) References Cited

U.S. PATENT DOCUMENTS

| | | | | |
|---|---|---|---|---|
| 2002/0042027 | A1* | 4/2002 | Chou | B82Y 10/00 430/322 |
| 2007/0231748 | A1* | 10/2007 | Sivakumar | H01L 21/0337 430/313 |
| 2012/0322224 | A1* | 12/2012 | Jeong | H01L 21/31144 438/382 |

* cited by examiner

*Primary Examiner* — Mohammad Islam
*Assistant Examiner* — Jay C Chang
(74) *Attorney, Agent, or Firm* — J.C. Patents

(57) ABSTRACT

A patterning method is provided. A substrate including a material layer thereon is provided. A patterned hard mask layer, having a plurality of first holes, is formed on the material layer. Afterward, a mask layer, including a plurality of line pattern masks extending in a direction and dividing each first hole into a second hole and a third hole, is formed. The material layer is patterned using the patterned hard mask layer and the mask layer as masks to form a patterned material layer having a plurality of fourth and fifth holes. Furthermore, a semiconductor structure is provided.

12 Claims, 8 Drawing Sheets

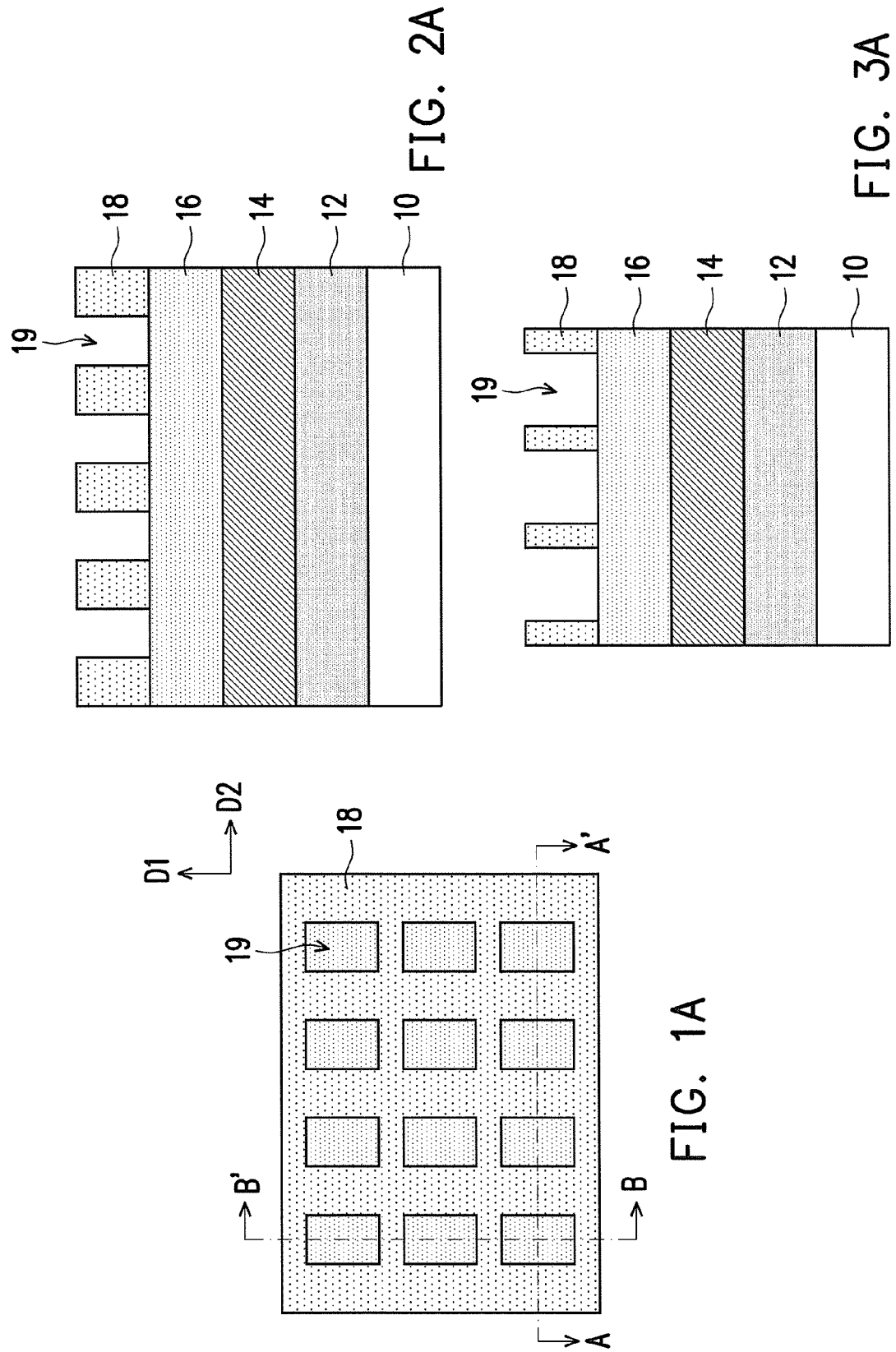

PATTERNING METHOD AND SEMICONDUCTOR STRUCTURE INCLUDING FORMING A PLURALITY OF HOLES USING LINE PATTERN MASKS

BACKGROUND OF THE INVENTION

1. Field of the Invention

The invention relates to an integrated circuit and more particularly relates to a patterning method and a semiconductor structure.

2. Description of Related Art

The conventional lithography techniques, such as ArF immersion lithography, can only form pitch of about 76 nm in one single process. If smaller pitch is desired, secondary lithography and etching processes are needed. However, misalignment may occur in a pattern formed by such a method, and because of the difficulty of the fabrication, it is also hard to control the critical dimension uniformity. Thus, a method for obtaining smaller pattern pitch using the existing lithography process is required.

SUMMARY OF THE INVENTION

The invention provides a patterning method, adapted for obtaining smaller pattern pitch and critical dimension and for aligning the formed patterns with each other, so as to overcome misalignment and improve critical dimension uniformity.

The patterning method of the invention includes the following. A material layer, a first hard mask layer, a second hard mask layer, and a first mask layer are formed in sequence on a substrate. The second hard mask layer is etched with the first mask layer as an etching mask to form a patterned second hard mask layer, wherein the patterned second hard mask layer includes a plurality of first holes, and a critical dimension (CD) of the first hole in a first direction is greater than a critical dimension of the first hole in a second direction. Then, the first mask layer is removed and a second mask layer is formed, wherein the second mask layer includes a plurality of line pattern masks extending in the second direction and dividing each of the first holes into a second hole and a third hole. The first hard mask layer and the material layer exposed by the second holes and the third holes are etched with the patterned second hard mask layer and the second mask layer as etching masks to form a patterned first hard mask layer and a patterned material layer. Next, the patterned first hard mask layer, the patterned second hard mask layer, and the second mask layer are removed to expose the patterned material layer, wherein the patterned material layer includes a plurality of fourth holes and a plurality of fifth holes.

In an embodiment of the invention, the first holes form a first hole array, and the patterned second hard mask layer is a mesh hard mask layer. The second holes and the third holes form a second hole array, and the patterned second hard mask layer and the second mask layer constitute a mesh etching mask. The fourth holes and the fifth holes form a third hole array, and the patterned material layer is a mesh material layer.

In an embodiment of the invention, the patterning method further includes filling each of the line pattern masks in a plurality of the first holes in the second direction to cover a portion of the patterned second hard mask layer.

In an embodiment of the invention, the patterning method further includes filling each of the line pattern masks in one single first hole in the second direction. Here, a length of each of the line pattern masks in the second direction is equal to the critical dimension of the corresponding first holes in the second direction.

In an embodiment of the invention, the patterning method further includes aligning each of the line pattern masks with a midline of the first holes in the first direction when filling each of the line pattern masks, such that the divided second holes and third holes have sizes equal to each other.

In an embodiment of the invention, the patterning method further includes adjusting a critical dimension of the line pattern mask in the first direction to adjust critical dimensions of the fourth holes and the fifth holes in the first direction.

In an embodiment of the invention, the second mask layer includes a patterned organic under layer disposed on the first hard mask layer, and a patterned silicon-containing hard-mask bottom anti-reflection coating layer disposed on the patterned organic under layer. Here, a method of forming the second mask layer includes: forming an organic under material layer, a hard-mask bottom anti-reflection material layer, and a patterned photoresist layer in sequence on the first hard mask layer; etching the organic under material layer and the hard-mask bottom anti-reflection material layer with the patterned photoresist layer as a mask to form the patterned organic under layer and the patterned silicon-containing hard-mask bottom anti-reflection coating layer; and removing the patterned photoresist layer.

The invention further provides a patterning method as follows. A substrate including a material layer is provided. A patterned hard mask layer is formed on the material layer, wherein the patterned hard mask layer includes a plurality of first holes. Then, a mask layer is formed, wherein the mask layer includes a plurality of line pattern masks extending in the second direction and dividing each of the first holes into a second hole and a third hole. Next, the material layer is patterned with the patterned hard mask layer and the mask layer as masks to form a patterned material layer including a plurality of fourth holes and a plurality of fifth holes.

In an embodiment of the invention, the first holes form a first hole array, and the patterned hard mask layer is a mesh hard mask layer. The second holes and the third holes form a second hole array, and the patterned hard mask layer and the mask layer constitute a mesh mask. The fourth holes and the fifth holes form a third hole array, and the patterned material layer is a mesh material layer.

In an embodiment of the invention, the patterning method further includes filling each of the line pattern masks in a plurality of the first holes in the second direction to cover a portion of the patterned hard mask layer.

In an embodiment of the invention, the patterning method further includes filling each of the line pattern masks in one single first hole in the second direction. Here, a length of each of the line pattern masks in the second direction is equal to the critical dimension of the corresponding first holes in the second direction.

In an embodiment of the invention, the patterning method further includes aligning each of the line pattern masks with a midline of the first holes in the first direction when filling each of the line pattern masks, such that the divided second holes and third holes have sizes equal to each other.

In an embodiment of the invention, the patterning method further includes adjusting a critical dimension of the line pattern mask in the first direction to adjust critical dimensions of the fourth holes and the fifth holes in the first direction.

The invention further provides a semiconductor structure including a patterned material layer disposed on a substrate. The patterned material layer includes a hole array which includes a plurality of hole columns extending in a first direction in parallel to each other, wherein each of the hole columns includes a plurality of holes arranged in a column in the first direction. Each of the holes in the hole columns has a side aligned with each other in the first direction and a side aligned with each other in a second direction.

According to the patterning method of the invention, the line pattern masks are overlapped in the patterned second hard mask layer to serve as the etching masks, so as to obtain smaller pattern pitch and critical dimension and align the formed patterns with each other, thereby overcoming misalignment and improving the critical dimension uniformity.

According to the patterning method of the invention, the critical dimension of the overlapping line pattern masks is adjusted to adjust the pattern pitch and the critical dimension thereof.

In the patterned material layer of the semiconductor structure of the invention, the sides of each hole in the first direction and the second direction are aligned respectively. Thus, higher critical dimension uniformity is achieved.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 1A to FIG. 1E are schematic top views showing a patterning method according to an embodiment of the invention.

FIG. 2A to FIG. 2E are schematic cross-sectional views taken along the line A-A' of FIG. 1A to FIG. 1E.

FIG. 3A to FIG. 3E are schematic cross-sectional views taken along the line B-B' of FIG. 1A to FIG. 1E.

DESCRIPTION OF THE EMBODIMENTS

Figure 2B:
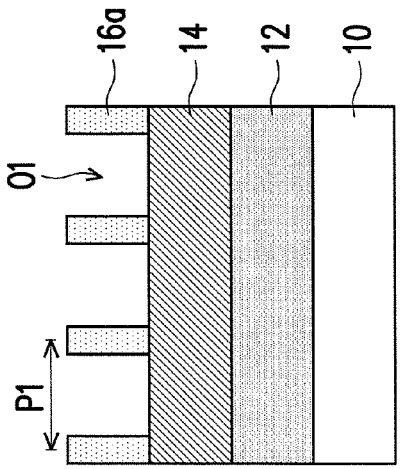
Figure 3B:
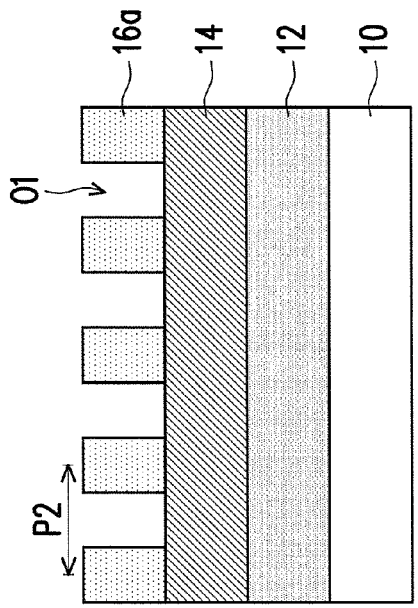

FIG. 1A to FIG. 1E are schematic top views showing a patterning method according to an embodiment of the invention. FIG. 2A to FIG. 2E are schematic cross-sectional views taken along the line A-A' of FIG. 1A to FIG. 1E. FIG. 3A to FIG. 3E are schematic cross-sectional views taken along the line B-B' of FIG. 1A to FIG. 1E.

With reference to FIG. 1A to FIG. 3A, a substrate 10 is provided, and a material layer 12 is formed on the substrate 10. The substrate 10 is a semiconductor substrate, a semiconductor compound substrate, or a semiconductor over insulator (SOI) substrate, for example. The semiconductor is IVA group atoms, such as silicon or germanium, for example. The semiconductor compound is formed of IVA group atoms, such as silicon carbide or silicon germanium, or formed of IIIA group atoms and VA group atoms, such as gallium arsenide, for example. The material layer 12 is a conductor layer, and a material thereof is metal, polysilicon, polycide, or metal silicide, for example, but the invention is not limited thereto. A dielectric layer or other semiconductor material layers or semiconductor devices may also be disposed between the substrate 10 and the material 12, but the invention is not limited thereto. Then, a first hard mask layer 14, a second hard mask layer 16, and a first mask layer 18 are formed in sequence on the material layer 12. A material of the first hard mask layer 14 is different from a material of the second hard mask layer 16. The materials of the first hard mask layer 14 and the second hard mask layer 16 may be silicon oxide, silicon oxynitride, silicon nitride, or polysilicon respectively, for example. The first mask layer 18 is a patterned photoresist layer, for example. A method of forming the patterned photoresist layer may include first forming a photoresist material layer, then performing an exposure process, and thereafter performing development, for example. A mask used in the exposure process is a halftone phase shift mask, a binary mask, or an opaque molybdenum silicon on glass mask; and the light source is Kr, ArF, i-ArF, or EUV, for example. The first mask layer 18 has a plurality of holes 19 that expose a portion of the second hard mask layer 16. The first mask layer 18 is a mesh mask layer, for example, and the holes 19 form a hole array. A critical dimension (CD) of each of the holes 19 in a first direction D1 is greater than a CD in a second direction D2. In an embodiment, the CD of each of the holes 19 of the first mask layer 18 in the first direction D1 is about 64 nm, and the CD in the second direction D2 is about 43 nm, for example. However, the invention is not limited thereto. The second direction D2 is different from the first direction D1. The second direction D2 and the first direction D1 may be perpendicular to each other, for example. The first direction D1 may be an X direction or a Y direction, and the second direction D2 may be the Y direction or the X direction. In the figures of this embodiment, the first direction D1 is the Y direction and the second direction D2 is the X direction, for example.

With reference to FIG. 1A to FIG. 3A and FIG. 1B to FIG. 3B, the second hard mask layer 16 is etched using the first mask layer 18 as an etching mask, so as to form a patterned second hard mask layer 16a. This etching process may be an anisotropic etching process, such as a dry etching process. The dry etching process is a plasma etching process, for example. The patterned second hard mask layer 16a has a plurality of first holes O1. In an embodiment, the first holes O1 form a first hole array. The patterned second hard mask layer 16a is a mesh hard mask layer. The first holes O1 expose a portion of the first hard mask layer 14, and a CD of the first hole O1 in the first direction D1 is greater than a CD in the second direction D2. In an embodiment, a pitch P1 in the first direction D1 and a pitch P2 in the second direction D2 are both about 86 nm, for example. The CD of the first hole O1 in the first direction D1 is about 64 nm, and the CD in the second direction D2 is about 43 nm, for example. However, the invention is not limited thereto. Next, the first mask layer 18 is removed.

With reference to FIG. 1B to FIG. 3B, FIG. 1C to FIG. 3C, and FIG. 4, thereafter, a second mask layer 20 is formed. A material of the second mask layer 20 and the second hard mask layer 16a is different from the material of the first hard mask layer 14 and/or the material layer 12. The second mask layer 20 is a pattern photoresist layer, for example. A method of forming the patterned photoresist layer may include first forming a photoresist material layer, then performing an exposure process, and thereafter performing development, for example. A mask used in the exposure process is a halftone phase shift mask, a binary mask, or an opaque molybdenum silicon on glass mask; and the light source is Kr, ArF, i-ArF, or EUV, for example. The mask and light source used for forming the second mask layer 20 may be the same as or different from the mask and light source used for forming the first mask layer 18. However, the invention is not limited thereto. The second mask layer 20 includes a plurality of line pattern masks. The line pattern mask extends in the second direction D2 and divides each of the first holes O1 into a second hole O2 and a third hole O3. In an embodiment, each of the first holes O1 is divided into two holes having sizes equal to each other. In other words, the CDs of the divided second hole O2 and third hole O3 in the first direction D1 are equal to each other. However, the invention is not limited thereto. In another embodiment, the second holes O2 and the third holes O3 form a second hole array. The patterned second hard mask layer 16a and the second mask layer 20 constitute a mesh etching mask.

Figure 1B:
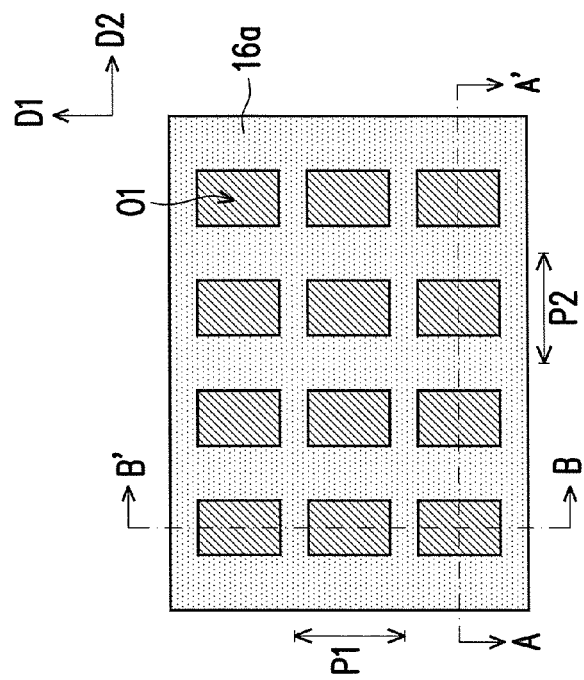
Figure 1C:
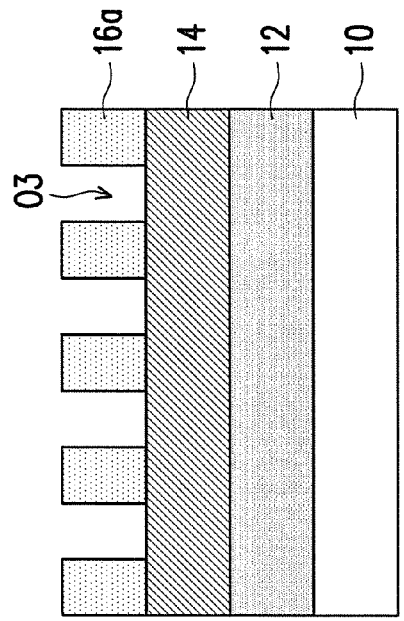
Figure 2C:
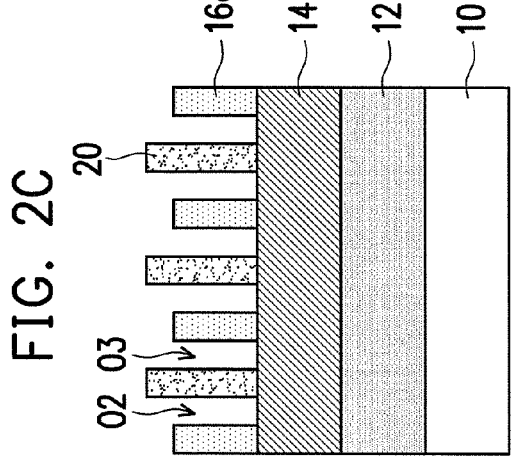
Figure 3C:
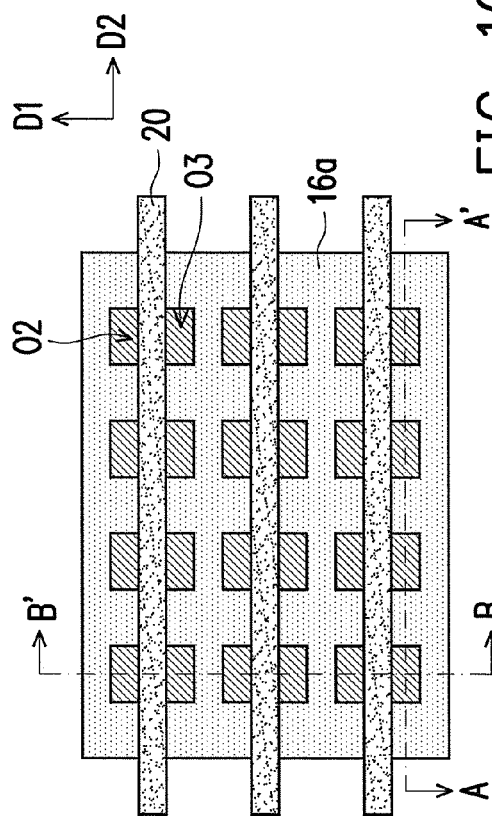

In an embodiment, as shown in FIG. 1B and FIG. 1C, each of the line pattern masks that serve as the second mask layer 20 is filled in multiple first holes O1 in the second direction D2 and extends continuously and covers a portion of the patterned second hard mask layer 16a. In another embodiment, as shown in FIG. 4, each of the line pattern masks that serve as the second mask layer 20 is filled in one single first hole O1 in the second direction D2, and a length of each of the line pattern masks in the second direction D2 is equal to the CD of the corresponding first hole O1 in the second direction D2.

Figure 2D:
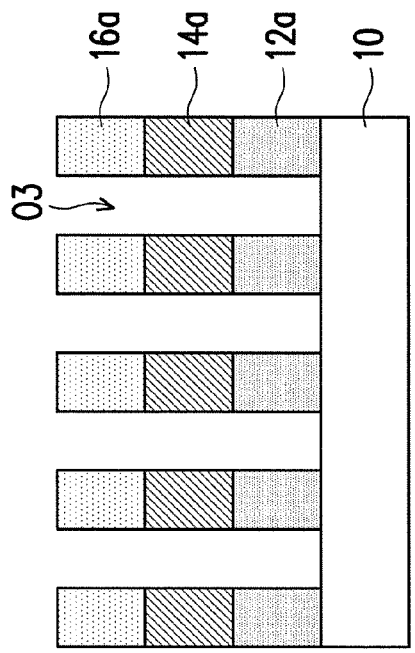
Figure 3D:
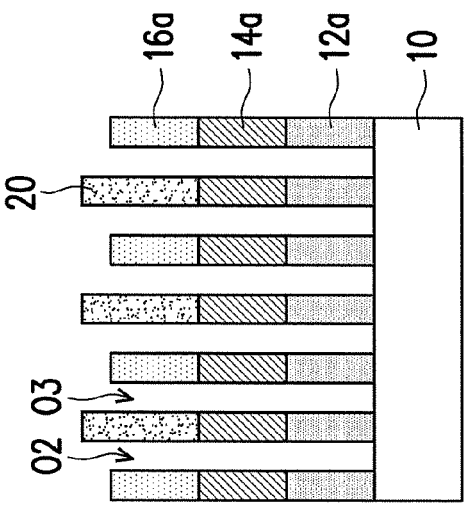
Figure 2E:
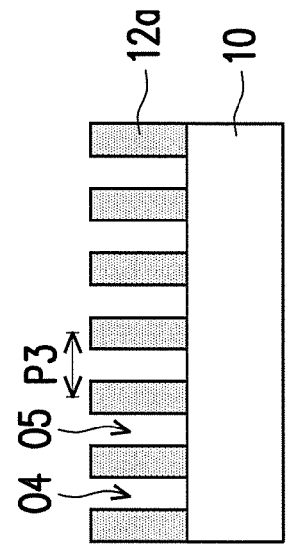
Figure 3E:
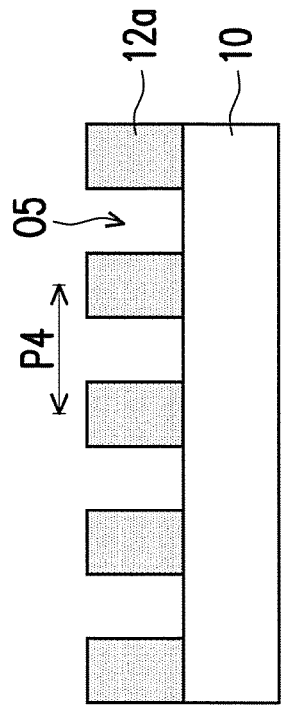

With reference to FIG. 1C to FIG. 3C and FIG. 1D to FIG. 3D, afterward, the first hard mask layer 14 and the material layer 12 exposed by the second holes O2 and the third holes O3 are etched using the patterned second hard mask layer 16a and the second mask layer 20 as etching masks, so as to form a patterned first hard mask layer 14a and a patterned material layer 12a, as shown in FIG. 2D and FIG. 3D, for example. This etching process may be an anisotropic etching process, such as a dry etching process. The dry etching process is a plasma etching process, for example. The materials of the second mask layer 20 and the second hard mask layer 16a are different from the material of the first hard mask layer 14 and/or the material layer 12.

With reference to FIG. 1E to FIG. 3E, then, the patterned first hard mask layer 14a, the patterned second hard mask layer 16a, and the second mask layer 20 are removed to expose the patterned material layer 12a. The patterned material layer 12a has a plurality of fourth holes O4 and a plurality of fifth holes O5. In an embodiment, the fourth holes O4 and the fifth holes O5 form a third hole array, and the patterned material layer 12a is a mesh material layer. In another embodiment, the CDs of the fourth holes O4 and the fifth holes O5 in the first direction D1 are equal to each other. That is, the fourth holes O4 and the fifth holes O5 have equal sizes. However, the invention is not limited thereto.

Figure 4:
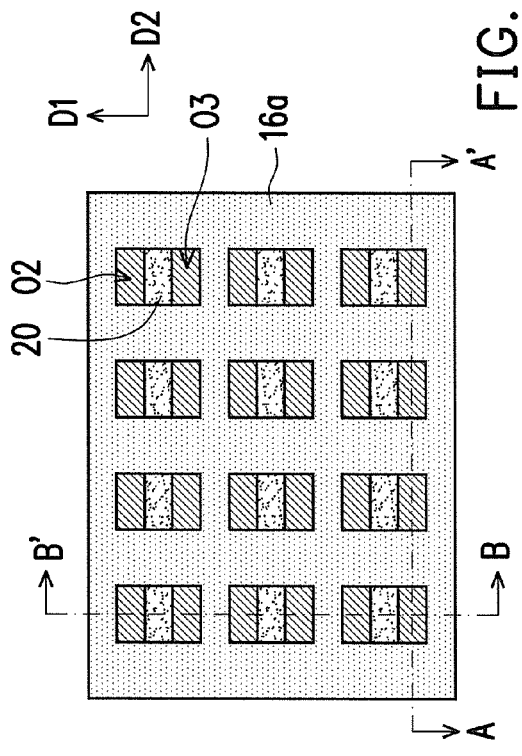
FIG. 4 is a schematic top view showing a patterning method according to another embodiment of the invention.
Figure 1D:
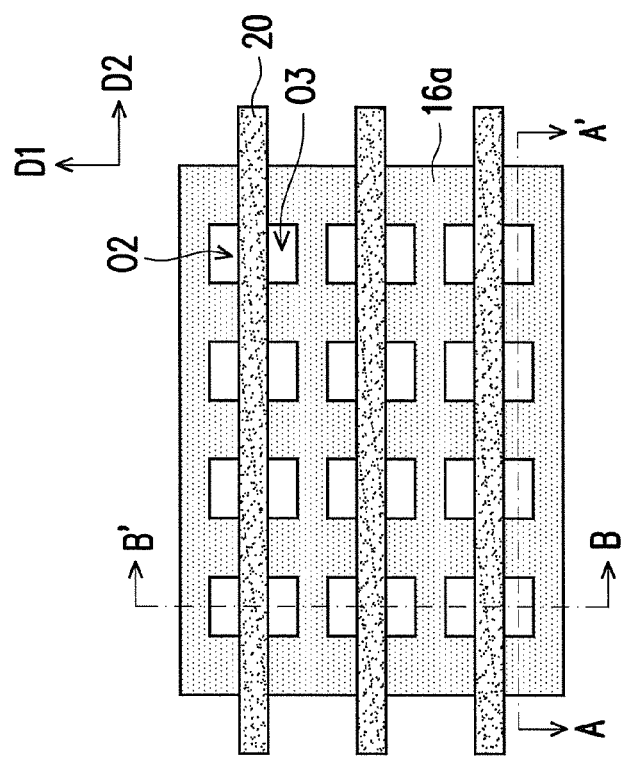
Figure 1E:
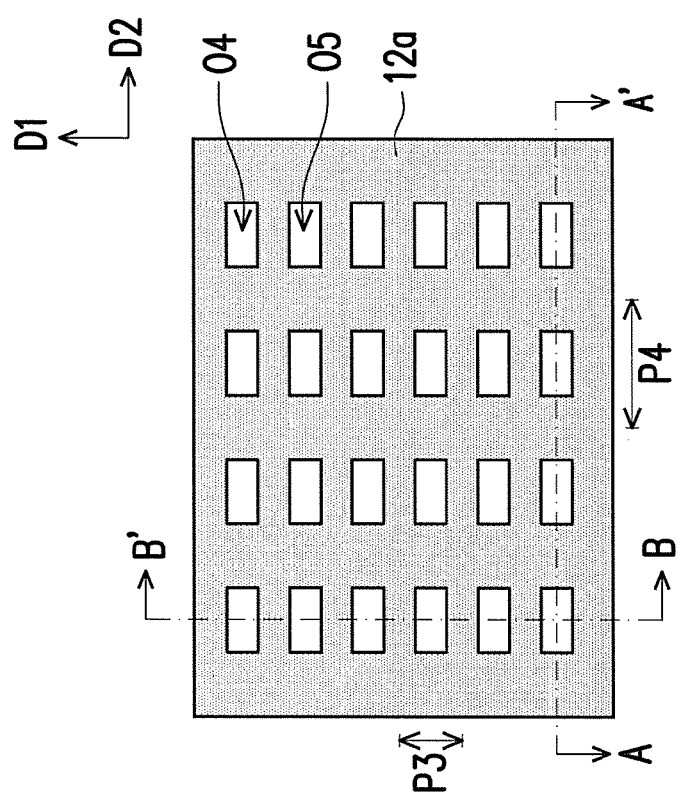

With reference to FIG. 1C, FIG. 4, and FIG. 1E, the CD of the line pattern mask that serves as the second mask layer 20 in the first direction D1 may be adjusted to adjust the CDs of the divided second hole O2 and third hole O3 in the first direction D1, so as to adjust the CDs of the fourth hole O4 and the fifth hole O5 formed in the patterned material layer 12a in the first direction D1. In other words, as the CD of the line pattern mask that serves as the second mask layer 20 in the first direction D1 increases, the CDs of the divided second hole O2 and third hole O3 in the first direction D1 decrease, and the CDs of the fourth hole O4 and the fifth hole O5 formed in the patterned material layer 12a in the first direction D1 decrease as well. In contrast, as the CD of the line pattern mask that serves as the second mask layer 20 in the first direction D1 decreases, the CDs of the divided second hole O2 and third hole O3 in the first direction D1 increase, and the CDs of the fourth hole O4 and the fifth hole O5 formed in the patterned material layer 12a in the first direction D1 increase as well.

In addition, with reference to FIG. 1C, FIG. 4, and FIG. 1E, when the line pattern mask that serves as the second mask layer 20 is filled in multiple or one single first hole O1 in the second direction D2, the line pattern mask may be aligned with a midline of the first hole O1 in the first direction D1 according to an embodiment of the invention. Accordingly, the first hole O1 is divided into two holes that have sizes equal to each other. That is, the CDs of the divided second hole O2 and third hole O3 in the first direction D1 are equal to each other. Then, the material layer 12 is patterned, such that the CDs of the fourth hole O4 and the fifth hole O5 in the patterned material layer 12a in the first direction D1 are equal to each other. That is, the fourth hole O4 and the fifth hole O5 have sizes that are equal to each other.

Moreover, with reference to FIG. 1B, FIG. 1C, FIG. 4, and FIG. 1E, according to an embodiment of the invention, the CD of the first hole O1 in the first direction D1 is about 64 nm and the CD in the second direction D2 is about 43 nm, for example. The pitch P in the first direction D1 and the pitch P2 in the second direction D2 are both about 86 nm, for example. The CD of the line pattern mask that serves as the second mask layer 20 in the first direction D1 is adjusted such that the CD of hole O2 or hole O3 and distance between the holes O2 and O3 in the first direction D1 are substantially equal to each other. In an embodiment, the CD of the line pattern mask that serves as the second mask layer 20 in the first direction D is about 21 nm, for example. Next, when the line pattern mask is filled in multiple or one single first hole O1 in the second direction D2, the line pattern mask is aligned with the midline of the first hole O1 in the first direction D1. Accordingly, the first hole O1 is divided into two small holes that have sizes equal to each other. That is, the CDs of the divided second hole O2 and third hole O3 in the first direction D1 are equal to each other. Then, the material layer 12 is patterned, such that the CDs of the fourth hole O4 and the fifth hole O5 in the patterned material layer 12a in the first direction D1 are equal to each other. That is, the fourth hole O4 and the fifth hole O5 have sizes that are equal to each other. The CDs of the fourth hole O4 and the fifth hole O5 in the first direction D11 are both about 21 nm, and the CDs in the second direction D2 are both about 43 nm, for example. It should be noted that a pitch P3 between the fourth hole O4 and the fifth hole O5 that have equal sizes in the first direction D1 is equal to each other, and a pitch P4 in the second direction D2 is also equal to each other. The pitch P3 between the fourth hole O4 and the fifth hole O5 that have equal sizes in the first direction D1 is about 43 nm, and the pitch P4 in the second direction D2 is about 86 nm, for example. More specifically, the patterned material layer 12a formed at this moment is a mesh material layer having a plurality of holes O4 and O5 that have equal sizes, and the pitch P3 between the holes O4 and O5 in the first direction D is equal to each other and the pitch P4 in the second direction D2 is equal to each other as well.

Figures 5A, 5B:
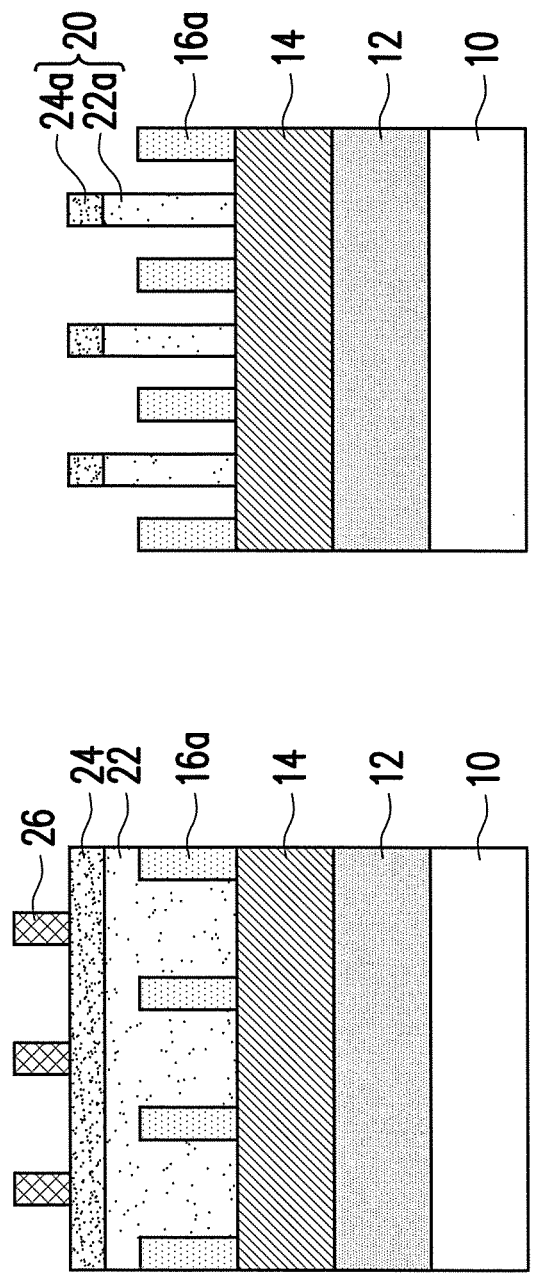
FIG. 5A to FIG. 5B are schematic cross-sectional views showing a patterning method according to yet another embodiment of the invention.

FIG. 5A to FIG. 5B are schematic cross-sectional views showing a patterning method according to yet another embodiment of the invention. The fabricating process of FIG. 5A to FIG. 5B is similar to the aforementioned process. Therefore, identical components/elements are represented by the same reference numerals, and the following paragraphs only describe the difference.

With reference to FIG. 5A to FIG. 5B, according to yet another embodiment of the invention, the second mask layer 20 may include a patterned organic under layer (ODL) 22a disposed on the first hard mask layer 14 and a patterned silicon-containing hard-mask bottom anti-reflection coating (SHB) layer 24a disposed on the patterned organic under layer 22a. The patterned organic under layer 22a is a self-assembled organic monolayer or a spin-coated organic layer, for example. A material of the patterned silicon-containing hard-mask bottom anti-reflection coating layer 24a may be an organosilicon polymer or polysilane used as a silicon-containing bottom anti-reflective coating (BARC), for example. Moreover, a method of forming the second mask layer 20 is as follows. With reference to FIG. 5A, an organic under material layer 22, a hard-mask bottom anti-reflection material layer 24, and a patterned photoresist layer 26 are formed in sequence on the first hard mask layer 14. The organic under material layer 22 and the hard-mask bottom anti-reflection material layer 24 are etched using the patterned photoresist layer 26 as a mask, so as to form the patterned organic under layer 22a and the patterned silicon-containing hard-mask bottom anti-reflection coating layer 24a shown as FIG. 5B. This etching process may be an anisotropic etching process, such as a dry etching process. The dry etching process is a plasma etching process, for example. Then, the patterned photoresist layer 26 is removed. Accordingly, the second mask layer 20 having the structure as shown in FIG. 5B is formed.

Figure 6A:
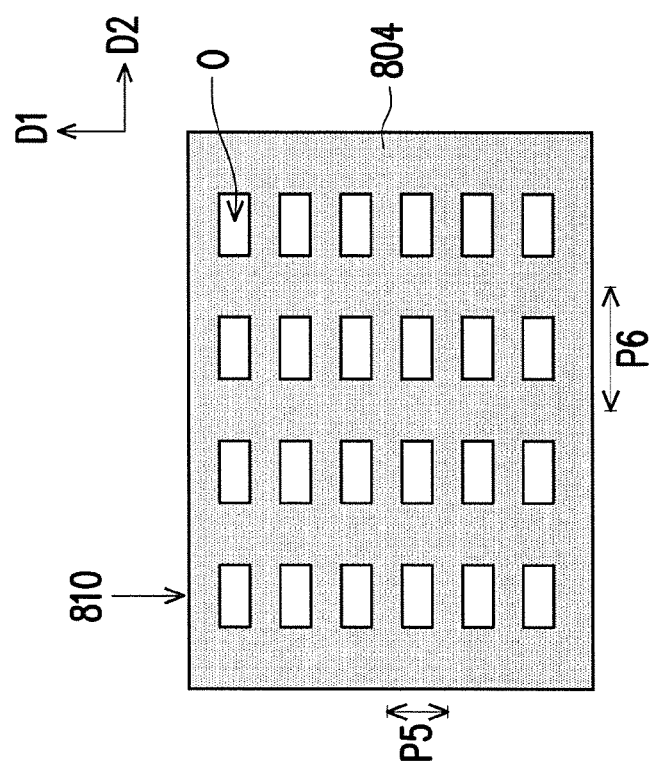
FIG. 6A is a schematic top view of a semiconductor structure according to an embodiment of the invention.
Figure 6B:
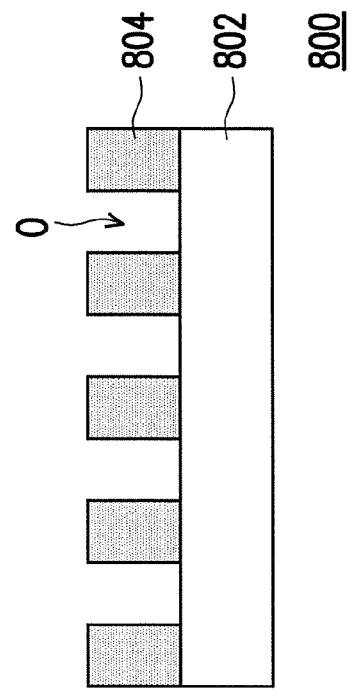
FIG. 6B is a schematic cross-sectional view of the semiconductor structure of FIG. 6A.
Figure 7:
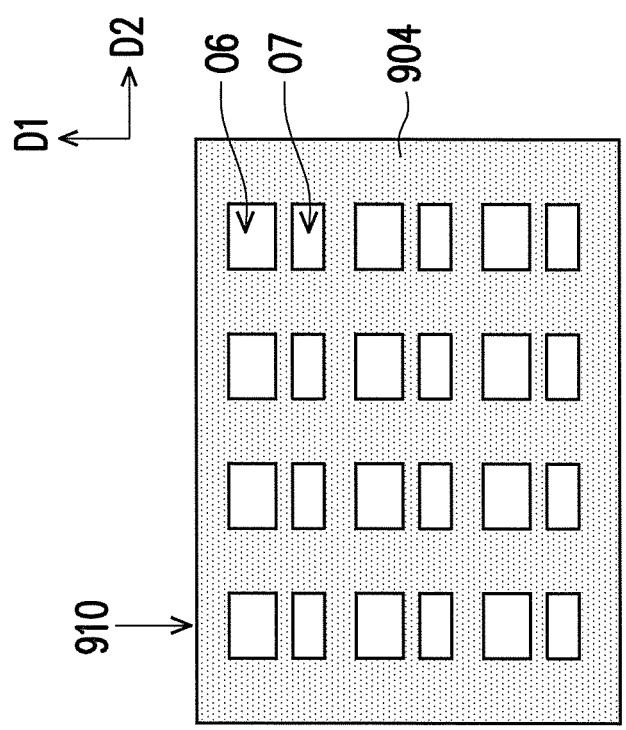
FIG. 7 is a schematic top view of a semiconductor structure according to another embodiment of the invention.

FIG. 6A is a schematic top view of a semiconductor structure according to an embodiment of the invention. FIG. 6B is a schematic cross-sectional view of the semiconductor structure of FIG. 6A. FIG. 7 is a schematic top view of a semiconductor structure according to another embodiment of the invention.

With reference to FIG. 6A to FIG. 6B, a semiconductor structure 800 includes a substrate 802 and a patterned material layer 804, wherein the patterned material layer 804 is disposed on the substrate 802. The substrate 802 is a semiconductor substrate, a semiconductor compound substrate, or a semiconductor over insulator (SOI) substrate, for example. The semiconductor is IVA group atoms, such as silicon or germanium, for example. The semiconductor compound is formed of IVA group atoms, such as silicon carbide or silicon germanium, or formed of IIIA group atoms and VA group atoms, such as gallium arsenide, for example. The patterned material layer 804 is a conductor layer, and a material thereof is metal, polysilicon, polycide, or metal silicide, for example, but the invention is not limited thereto. A dielectric layer or other semiconductor material layers or semiconductor devices may also be disposed between the substrate 802 and the material layer 804, but the invention is not limited thereto. Although the figures of this embodiment of the invention illustrate a case where no dielectric layer or other semiconductor material layer is disposed between the substrate 802 and the material layer 804, it should be noted that the disclosure of FIG. 6A to FIG. 6B is merely an example and is not intended to limit the invention.

With reference to FIG. 6A to FIG. 6B again, the patterned material layer 804 includes a hole array, which includes a plurality of hole columns 810 extending in the first direction D1 in parallel to each other. Each of the hole columns 810 includes a plurality of holes O arranged in a column in the first direction D1, wherein the sides of the holes O in each hole column 810 in the first direction D are aligned with each other and the sides in the second direction D2 are aligned with each other as well. The second direction D2 is different from the first direction D1. The second direction D2 and the first direction D1 may be perpendicular to each other, for example. The first direction D1 may be the X direction or the Y direction, and the second direction D2 may be the Y direction or the X direction. In the figures of this embodiment, the first direction D1 is the Y direction and the second direction D2 is the X direction, for example.

With reference to FIG. 6A to FIG. 6B again, according to an embodiment of the invention, the holes O in the patterned material layer 804 have sizes equal to each other. That is, the CDs of the holes O in the first direction D1 are equal to each other, and the CDs in the second direction D2 are equal to each other as well. Further, according to yet another embodiment of the invention, the holes O in the patterned material layer 804 have equal sizes, and what is more, a pitch P5 in the first direction D1 is equal to each other and a pitch P6 in the second direction D2 is equal to each other as well. Here, the CD of the hole O in the first direction D1 is about 21 nm, and the CD in the second direction D2 is about 43 nm, for example. The pitch P5 in the first direction D1 is about 43 nm, and the pitch P6 in the second direction D2 is about 86 nm, for example.

With reference to FIG. 7, according to the method of the above embodiment of the invention, when misalignment occurs in the line pattern masks that serve as the second mask layer 20 in FIG. 1C or FIG. 4, the line pattern masks are not aligned with the midline of the first hole O1 in the first direction D1 and the divided two holes have different sizes, which results in that the six hole O6 and the seventh hole O7 formed in a material layer 904 have different sizes. More specifically, a hole array in the patterned material layer 904 includes a plurality of hole columns 910 extending in the first direction D1 in parallel to each other. Each hole column 910 includes a plurality of sixth holes O6 and seventh holes O7 arranged in a column in the first direction D1. The sixth hole O6 and the seventh hole O7 have different sizes. In other words, the CDs of the sixth hole O6 and the seventh hole O7 in the first direction D1 are not equal to each other, but the CDs thereof in the second direction D2 are equal to each other. However, the sides of each pair of sixth hole O6 and seventh hole O7 in the first direction D1 are still aligned with each other, and the sides thereof in the second direction D2 are aligned with each other as well. The sides of each sixth hole O6 and each seventh hole O7 in each hole column 910 in the first direction D1 are aligned with each other, and the sides thereof in the second direction D2 are aligned with each other as well.

To sum up, according to the patterning method of the invention, multiple line pattern masks overlap in the mesh hard mask layer having a plurality of holes to serve as the masks for lithography and etching. By dividing each hole of the mesh hard mask layer into two smaller holes with the line pattern masks, the pattern pitch and critical dimension are formed smaller in comparison with the conventional method, and the formed patterns are aligned with each other, so as to overcome misalignment and improve the critical dimension uniformity. In addition, the width of the overlapping line pattern masks is adjusted to adjust the pattern pitch and the critical dimension thereof. Further, in the patterned material layer of the semiconductor structure of the invention, the sides of each hole in the first direction and the second direction are aligned respectively. Thus, higher critical dimension uniformity is achieved.

It will be apparent to those skilled in the art that various modifications and variations can be made to the disclosed embodiments without departing from the scope or spirit of the invention. In view of the foregoing, it is intended that the invention covers modifications and variations of this disclosure provided they fall within the scope of the following claims and their equivalents.

What is claimed is:

1. A patterning method, comprising:
    forming a material layer, a first hard mask layer, a second hard mask layer, and a first mask layer in sequence on a substrate;
    etching the second hard mask layer with the first mask layer as an etching mask to form a patterned second hard mask layer, wherein the patterned second hard mask layer comprises a plurality of first holes, the first holes are closed holes, and a critical dimension of the first hole in a first direction is greater than a critical dimension of the first hole in a second direction;
    removing the first mask layer;
    forming a second mask layer, wherein the second mask layer comprises a plurality of line pattern masks extending in the second direction and dividing each of the first holes into a second hole and a third hole;
    etching the first hard mask layer and the material layer exposed by the second holes and the third holes with the patterned second hard mask layer and the second mask layer as etching masks to form a patterned first hard mask layer and a patterned material layer; and
    removing the patterned first hard mask layer, the patterned second hard mask layer, and the second mask layer to expose the patterned material layer, wherein the patterned material layer comprises a plurality of fourth holes and a plurality of fifth holes.

2. The patterning method according to claim 1, wherein the first holes form a first hole array, and the patterned second hard mask layer is a mesh hard mask layer.

3. The patterning method according to claim 1, wherein the second holes and the third holes form a second hole array, and the patterned second hard mask layer and the second mask layer constitute a mesh etching mask.

4. The patterning method according to claim 1, wherein the fourth holes and the fifth holes form a third hole array, and the patterned material layer is a mesh material layer.

5. The patterning method according to claim 1, wherein each of the line pattern masks is filled in a plurality of the first holes in the second direction and covers a portion of the patterned second hard mask layer.

6. The patterning method according to claim 5, wherein each of the line pattern masks is aligned with a midline of the first holes in the first direction when filled, such that the divided second holes and third holes have sizes equal to each other.

7. The patterning method according to claim 1, wherein each of the line pattern masks is filled in one single first hole in the second direction.

8. The patterning method according to claim 7, wherein a length of each of the line pattern masks in the second direction is equal to the critical dimension of the corresponding first holes in the second direction.

9. The patterning method according to claim 7, wherein each of the line pattern masks is aligned with the midline of the one single first hole in the first direction, such that the divided second holes and third holes have sizes equal to each other.

10. The patterning method according to claim 1, further comprising: adjusting a critical dimension of the line pattern mask in the first direction to adjust critical dimensions of the fourth holes and the fifth holes in the first direction.

11. The patterning method according to claim 1, wherein the second mask layer comprises:
    a patterned organic under layer disposed on the first hard mask layer; and
    a patterned silicon-containing hard-mask bottom anti-reflection coating layer disposed on the patterned organic under layer.

12. The patterning method according to claim 11, wherein a method of forming the second mask layer comprises:
    forming an organic under material layer, a hard-mask bottom anti-reflection material layer, and a patterned photoresist layer in sequence on the first hard mask layer;
    etching the organic under material layer and the hard-mask bottom anti-reflection material layer with the patterned photoresist layer as a mask to form the patterned organic under layer and the patterned silicon-containing hard-mask bottom anti-reflection coating layer; and
    removing the patterned photoresist layer.

* * * * *